United States Patent
Einhaus et al.

(10) Patent No.: US 7,442,255 B2
(45) Date of Patent: Oct. 28, 2008

(54) CRUCIBLE FOR A DEVICE FOR PRODUCING A BLOCK OF CRYSTALLINE MATERIAL AND METHOD FOR PRODUCING SAME

(75) Inventors: Roland Einhaus, Bourgoin Jallieu (FR); Francois C. Lissalde, Seyssins (FR); Pascal Rivat, Saint Etienne de Saint Geoirs (FR)

(73) Assignees: Apollon Solar, Paris (FR); Cyberstar, Echirolles (FR); EFD Induction SA, Seyssinet-Pariset (FR)

( * ) Notice: Subject to any disclaimer, the term of this patent is extended or adjusted under 35 U.S.C. 154(b) by 407 days.

(21) Appl. No.: 10/550,456
(22) PCT Filed: Apr. 9, 2004
(86) PCT No.: PCT/FR2004/000894

§ 371 (c)(1),
(2), (4) Date: Sep. 26, 2005

(87) PCT Pub. No.: WO2004/094704
PCT Pub. Date: Nov. 4, 2004

(65) Prior Publication Data
US 2006/0144326 A1    Jul. 6, 2006

(30) Foreign Application Priority Data
Apr. 17, 2003   (FR) .................................. 03 04803

(51) Int. Cl.
*C30B 35/00* (2006.01)
(52) U.S. Cl. ........................ 117/200; 117/213; 117/900; 65/374.12; 65/DIG. 8
(58) Field of Classification Search ............... 65/374.13, 65/DIG. 8, 374.12; 117/200, 213, 900
See application file for complete search history.

(56) References Cited

U.S. PATENT DOCUMENTS

| 4,382,838 A | 5/1983 | Authier |
| 6,165,425 A | 12/2000 | Lange |

FOREIGN PATENT DOCUMENTS

DE        25 43 752 A1    4/1977

(Continued)

OTHER PUBLICATIONS

Fused Silica Design Manual, Engineering Experiment Station, Georgia Institute of Technology, Atlanta, GA, May 1973, vol. 1, pp. 4-29-4-37.

*Primary Examiner*—Felisa C Hiteshew
(74) *Attorney, Agent, or Firm*—Oliff & Berridge, PLC

(57) ABSTRACT

The bottom of the crucible has much greater thermal transfer properties, parallel to an axis substantially perpendicular to the bottom, than those of the side walls. The bottom and side walls are formed by materials having the same main chemical constituents. The bottom can be transparent to infrared radiation and the side walls opaque to infrared radiation. The bottom can be made of amorphous silica and the side walls of opaque quartz ceramic. The crucible can also be made of graphite. The device can comprise a graphite felt, arranged between the bottom of the crucible and cooling means, and compression means of the graphite felt. It is thus possible to define a temperature gradient comprised between 8° C./cm and 30° C./cm in the liquid phase.

12 Claims, 1 Drawing Sheet

FOREIGN PATENT DOCUMENTS

| | | |
|---|---|---|
| DE | 42 36 827 A1 | 5/1994 |
| DE | 42 36 827 A1 | 10/1994 |
| EP | 0 424 981 A1 | 5/1991 |
| FR | 2 487 863 | 2/1982 |
| FR | 2 509 638 | 1/1983 |
| GB | 2 218 789 A | 11/1989 |
| JP | A 07-010672 | 1/1995 |
| JP | 08301683 A * | 11/1996 |
| JP | 09157082 A * | 6/1997 |
| JP | A 10-139580 | 5/1998 |
| JP | A 2000-351688 | 12/2000 |

* cited by examiner

CRUCIBLE FOR A DEVICE FOR PRODUCING A BLOCK OF CRYSTALLINE MATERIAL AND METHOD FOR PRODUCING SAME

BACKGROUND OF THE INVENTION

The invention relates to a crucible for a device for producing a block of crystalline material by directed crystallization, presenting side walls and a bottom, the bottom having, parallel to a direction substantially perpendicular to the bottom, much greater heat transfer properties than those of the side walls along said direction.

STATE OF THE ART

Convention technologies for obtaining multi-crystalline solid silicon for photovoltaic applications meet limitations
   economically by the crystallization time necessary, related to the volume and height of the silicon block,
   technically by the performances of the semi-conducting devices, related to the minority carrier diffusion length,
   by uncontrolled lateral growths generating material losses and requiring peeling,
   by diffusion of impurities from the crucible into the silicon, requiring peeling.

In order to make improvements to these limitations, considerable efforts have been made in furnace design and in the quality of the material to be solidified. Thus, plasma purification and furnace design enabling segregation of the metallic impurities, have indeed enabled the performances of solar cells obtained in this way to be improved, but have always encountered a techno-economic limitation in the volume and height of the crystallized silicon block.

Solidification of the silicon from a liquid silicon bath is typically achieved by directed crystallization, i.e. by migration of a solidification front (solid/liquid interface) from an initially solidified part, in particular a seed or a first layer crystallized by local cooling. Thus, the solid silicon block grows progressively feeding on the liquid bath. The two conventionally used methods are the Czochralski method, the Bridgman method or variants thereof. According to the Czochralski method, a seed, often oriented with respect to a crystalline axis of the solid silicon, is dipped into the molten bath and then raised slowly. The liquid silicon bath and the temperature gradient then remain immobile, whereas according to the Bridgman method, the bath is moved with respect to the temperature gradient, or the temperature gradient is moved with respect to the bath.

The present invention relates to the Bridgman method. As represented in FIG. 1, a recipient containing the silicon conventionally consists of a molded quartz crucible 1 arranged in an insulating enclosure 2 made of insulating material. A temperature gradient is created between heating means 3, arranged at the top part of the insulating enclosure 2, and cooling means 4, arranged at the bottom part of the insulating enclosure 2. The solid silicon 5, obtained from the liquid silicon 6, often presents non-homogeneities, for example a fine particle structure ("microgrit") that has not reached the critical size of the crystallization seed and is in the form of a cluster, which reduces the minority carrier diffusion length. Another problem is the creation of liquid pockets, due to the critical end of crystallization periods, a disastrous phenomenon well known to the man of the art. Furthermore, the isothermal surfaces in the silicon do not present parallel planes, which also impairs the quality of the solid silicon obtained.

The document JP 07,010,672 describes a platinum crucible installed in an electric furnace for growth of monocrystals according to the Bridgman method. The crucible contains a liquid brought into contact with a crystal acting as crystallization seed and arranged in the bottom part of the crucible. A transparent substance is placed under the crystal. The crucible material is reflecting. Such a crucible is difficult to implement.

The document FR 2,509,638 describes a mold for molding silicon cylinders designed to be used as material for producing solar cells. The mold comprises, in a metallic external enclosure, a thick, thermally insulating, coating, for example made of ceramic fibers, disposed around the thin side walls of a recipient made of graphite fibers or ceramic. A bottom layer, for example made of silica sand, is disposed under the recipient. Such a mold is complex and bulky.

OBJECT OF THE INVENTION

The object of the invention is to remedy these shortcomings and, in particular, a device and a method for producing a block of crystalline material by directed crystallization, enabling, in particular, sufficiently pure multi-crystalline silicon with a crystalline structure suitable for photovoltaic applications to be obtained, while reducing the production costs.

According to the invention, this object is achieved by the appended claims and, more particularly, by the fact that the bottom and the side walls are formed by materials having the same main chemical constituents.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
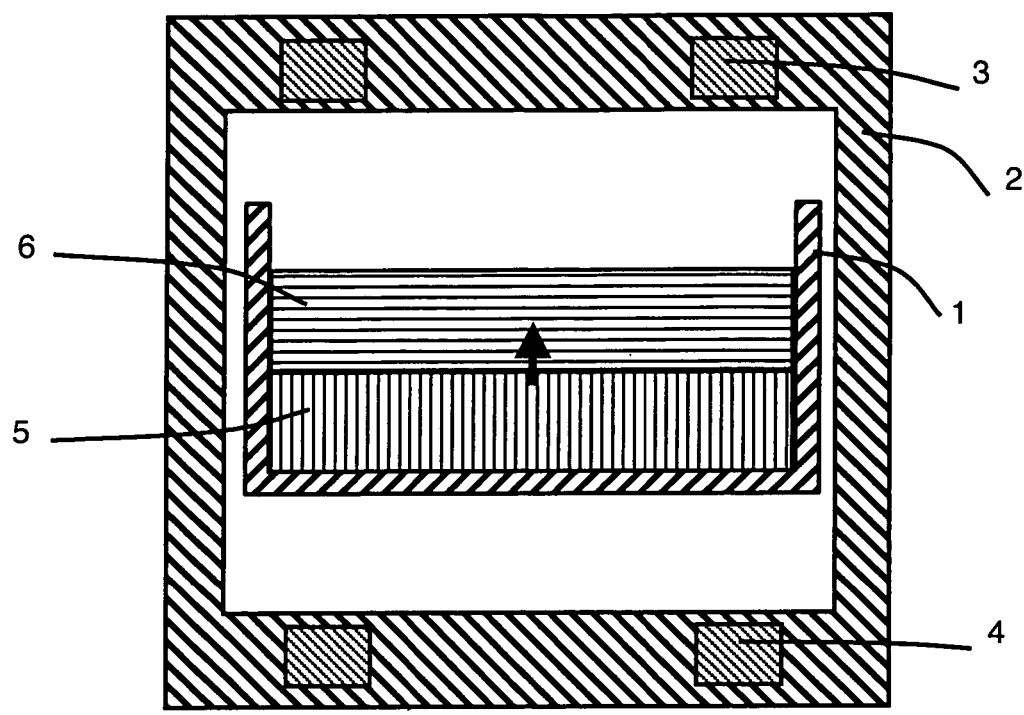
FIG. 1 shows a device for producing a block of crystalline material by directed crystallization according to the prior art.
Figure 2:
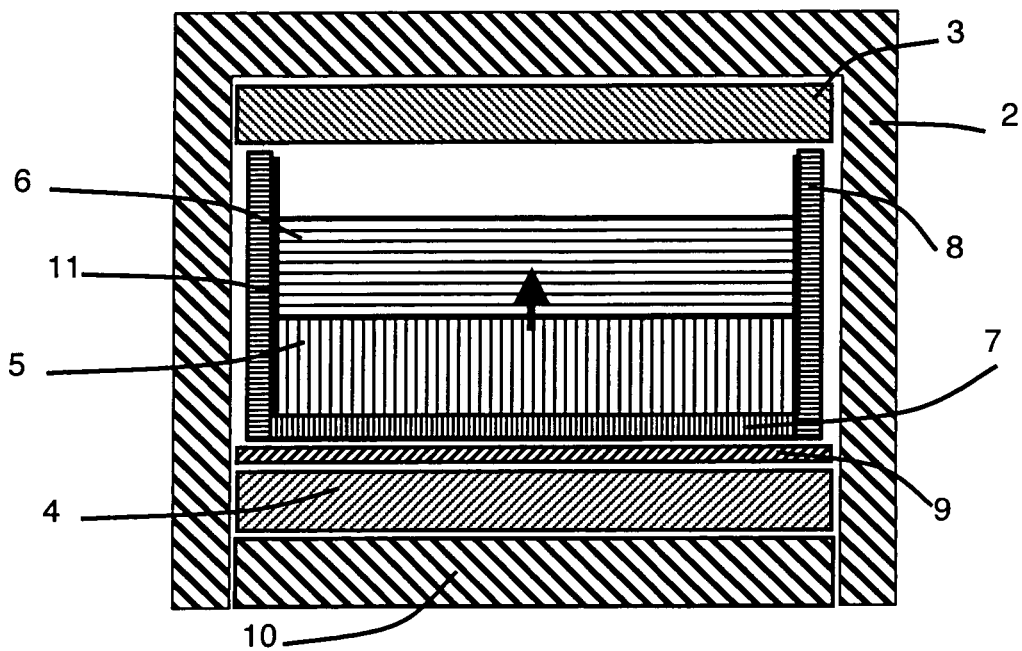
FIG. 2 shows a device according to the invention comprising a crucible according to the invention.

The device for producing a block of crystalline material by directed crystallization, represented in FIG. 2, comprises an insulating assembly or enclosure 2 and a crucible the bottom 7 whereof is fixedly secured to the side walls 8. The bottom 7 and the side walls then form a single part. The bottom 7 has much greater heat transfer properties, in a direction parallel to an axis substantially perpendicular to the bottom 7, than those of the side walls 8 of the crucible along said axis. The heat transfer properties comprise on the one hand the thermal conductivity of the material and on the other hand its infrared radiation transmission coefficient. The bottom 7 and the side walls 8 are formed by materials having the same main chemical constituents. Thus, the bottom 7 can be joined, without difficulty, for example soldered, to the side walls 8 and the thermal expansion coefficients of the materials are substantially the same. The main constituent of each of the materials can, for example, be the $SiO_2$ chemical entity, the arrangement in space of the $SiO_2$ chemical entities constituting the bottom 7 being different from the arrangement in space of the $SiO_2$ chemical entities constituting the side walls 8.

Heating means 3 and cooling means 4 are respectively formed by a heating resistance arranged above the crucible, in the insulating enclosure 2, and by a heat exchanger, arranged under the crucible, in the insulating enclosure 2. The heating resistance and heat exchanger are sufficiently wide to completely cover the crucible. The heating means can also be formed by induction heating means.

Henceforth, several particular embodiments are described with reference to production of a silicon block. However, the invention applies to any type of crystalline material.

In a particular embodiment, the bottom 7 of the crucible is transparent to infrared radiation, whereas the side walls 8 are opaque to infrared radiation. Such a crucible can be formed by a bottom 7 made of amorphous silica and side walls 8 made of opaque quartz ceramic. The materials have $SiO_2$ as their main constituent and only differ by their crystallographic structure and the arrangement of the $SiO_2$ constituents in space. Thus, the infrared radiation emitted by the solid silicon 5 contained in the crucible is transmitted to the heat exchanger 4 via the transparent amorphous silica, which enables the heat to be removed from the solid silicon 5 and a temperature gradient of at least 8° C./cm to be established in the crucible. A predetermined temperature gradient does in fact require efficient heat removal, proportional to the temperature gradient. The opacity of the side walls 8, on the other hand, prevents exchange of infrared radiation by means of the walls, which would result in convection of the liquid silicon. Thus, the isothermal surfaces are substantially flat and parallel, and the solidification front is consequently also substantially flat, in a direction parallel to the bottom 7 of the crucible.

When the crucible is fabricated, the quartz opaque ceramic side walls 8 and the amorphous silica bottom 7 are securely affixed to one another, for example by heating the parts, respectively of the side walls 8 and of the bottom 7, designed to form the junction. The heating temperature is higher than the fusion temperature of the materials, about 2000° C., and this can be performed by means of a blow-lamp. The materials are then closely bonded.

It should be noted that the thermal conductivities of the amorphous silica on the one hand, and of the opaque quartz ceramic on the other hand, are practically of the same order of magnitude, about 2 W/(m° C.). The heat transfer difference is then only due to the transparency to infrared radiation.

When crystallization of the silicon takes place, the thickness of the solid phase increases so that the solidification front progresses upwards moving away from the bottom of the crucible. As the fusion temperature of silicon is 1410° C., the 1410° C. isothermal surface then moves away from the bottom of the crucible, which leads to a decrease of the temperature at the bottom of the crucible in the course of the crystallization process. However, the power emitted by radiation by any body decreases with temperature.

For the thermal power removed by the cooling means 4 to remain substantially constant throughout the solidification process, it is possible to integrate a graphite felt 9 in the device (FIG. 2), arranged between the bottom of the crucible and the cooling means 4, and compression means 10 of the graphite felt during solidification of the silicon. In FIG. 2, the cooling means 4 and the graphite felt 9 are arranged between the compression means 10 and the crucible, so that the compression means 10 exert a pressure against the crucible and the cooling means. Thus, the thickness of the graphite felt 9 decreases and its thermal conductivity increases. The heat transfer by conductivity of the graphite felt 9 can then be controlled by the compression means 10. During the solidification process, the compression force can be progressively increased to compensate the decrease of the heat transfer by radiation through the bottom of the crucible. Consequently, during the solidification process, the temperature gradient in the crucible can be controlled and kept at a value comprised between 8° C./cm and 30° C./cm, and preferably between 10° C./cm and 20° C./cm, which enables the crystallization rate to be increased. The thickness of the uncompressed graphite felt is 5 mm, whereas its thickness is 3.5 mm under compression.

The heat exchanger typically comprises a coolant circuit and, depending on the applications, the coolant can be synthetic oil having for example a temperature of use of less than 300° C., or a fluid operating at high temperature, for example a gas under pressure, for example helium. It is possible to vary the temperature of the coolant in controlled manner to ensure that the power removed remains constant throughout solidification.

In another particular embodiment, the bottom 7 and the side walls 8 are formed by plates made from the same material having anisotropic thermal conduction properties. The thermal conduction of the plates, in the plane of the plates, is much lower than their thermal conductivity perpendicularly to this plane. For example, the crucible can be achieved with a graphite having highly anisotropic properties, due to its geometric structure. A crucible can notably be achieved having a bottom and side walls formed by graphite plates having a low thermal conductivity in the plane of the plates and a high thermal conductivity in a direction perpendicular to the plane. Thus, the thermal energy of the silicon is transmitted to the heat exchanger by conduction through the bottom 7, whereas the thermal conduction in the side walls is very low in a direction parallel to this axis substantially perpendicular to the bottom. This embodiment also enables a temperature gradient of at least 8° C./cm to be established and a substantially flat solidification front to be achieved.

In a preferred embodiment, the crucible comprises a coating 11 on an inside face and/or an outside face of the side walls, which enables the heat transfer properties of the side walls to be modified. A silicon nitride deposit on the inside face of the side walls 8, for example, enables the emissivity of the side walls 8 to be reduced and thus enables the heat transfer by radiation to be reduced. A coating comprising a reflecting material disposed on the outside face of the side walls 8 also enables the heat transfer through the side walls 8 to be reduced.

According to a non-restrictive numerical example, a square crucible with sides of 450 mm and a height of 250 mm is filled with 50 liters of liquid silicon, which corresponds to 128 kg of silicon. Typically, the thickness of the side walls of the crucible is 10 mm and the thickness of the bottom of the crucible is 10 mm. Crystallization advantageously takes place at a determined rate of 20 mm/h and consequently lasts for 12 hours and 30 minutes. The initial temperature difference between the top and bottom of the crucible is 375° C., which corresponds to a temperature gradient of 15° C./cm in the liquid phase. The power $P_J$ dissipated by Joule effect in the heating resistance is essentially recovered at the level of the heat exchanger situated under the crucible, ignoring the heat losses transmitted by the insulating enclosure 2 to the outside. In addition to the power $P_J$, a power $P_L$, restored when crystallization takes place by the latent heat of the liquid/solid transition, is recovered at the level of the heat exchanger. The power $P_J$, dependent on the temperature gradient in the liquid phase and on the conductivity of the liquid silicon (56 W/(m° C.)), is about 17 kW for the device considered in the example, whereas the power $P_L$, dependent on the crystallization rate, is about 5 kW, the power removed in the heat exchanger then being about 22 kW. Considering a completely transparent crucible bottom 7, a thermal power of 22 kW can be removed by radiation by a heat exchanger kept at a temperature of 20°

C., for a solid silicon temperature of 1150° C. at the bottom of the crucible, the emissivity of the silicon being about 0.5.

The invention enables controlled crystallization of sufficiently pure multi-crystalline silicon with a crystalline structure suitable for photovoltaic applications. The invention also enables a faster crystallization rate to be obtained to produce a block of multi-crystalline silicon of larger height than the height obtained with known techniques, and thus enables a greater efficiency of the fluids used for the cooling means to be achieved. Due to the temperature gradient comprised between 8° C./cm and 30° C./cm, to the thermal anisotropy of the crucible and to the thermal assembly around the crucible, the solidification front is better stabilized, segregation of the metallic impurities is improved and the size and structure of the crystalline grains are improved. As a result, the multi-crystalline silicon thus obtained is characterized by a larger minority carrier diffusion length on account of which the performances of the photovoltaic devices are increased.

The invention claimed is:

1. A crucible for a device for producing a block of crystalline material by directed crystallization, said crucible presenting side walls opaque to infrared radiation and a bottom transparent to infrared radiation, the bottom having, parallel to a direction substantially perpendicular to the bottom, much greater heat transfer properties than those of the side walls along said direction.

2. The crucible according to claim 1, wherein the bottom is made of amorphous silica, the side walls being made of opaque quartz ceramic.

3. The crucible according to claim 1, wherein the crucible comprises at least one coating on at least one face of the side walls.

4. The crucible according to claim 3, wherein the material of the coating is chosen from silicon nitride and reflecting materials.

5. A device for producing a block of crystalline material by directed crystallization, comprising a crucible arranged in an insulating enclosure between heating means arranged above the crucible and cooling means arranged below the crucible, wherein the crucible is a crucible according to claim 1.

6. The device according to claim 5, comprising a graphite felt, arranged between the bottom of the crucible and the cooling means, and compression means to compress the graphite felt during crystallization of the crystalline material.

7. A crucible for a device for producing a block of crystalline material by directed crystallization, Presenting side walls and a bottom, the bottom and side walls are formed by plates made from the same material having anisotropic thermal conduction properties, the thermal conductivity of the plates, in the plane of the plates, being much lower than their thermal conductivity perpendicularly to this plane.

8. The crucible according to claim 7, wherein the crucible is made of graphite.

9. The crucible according to claim 7, wherein the crucible comprises at least one coating on at least one face of the side walls.

10. The crucible according to claim 9, wherein the material of the coating is chosen from silicon nitride and reflecting materials.

11. A device for producing a block of crystalline material by directed crystallization, comprising a crucible arranged in an insulating enclosure between heating means arranged above the crucible and cooling means arranged below the crucible, wherein the crucible is a crucible according to claim 7.

12. The device according to claim 11, comprising a graphite felt, arranged between the bottom of the crucible and the cooling means, and compression means to compress the graphite felt during crystallization of the crystalline material.

* * * * *